United States Patent [19]

Audaire et al.

[11] 4,241,262

[45] Dec. 23, 1980

[54] CIRCUIT FOR MEASURING THE CHARGE STORED IN A CHARGE-COUPLED DEVICE

[75] Inventors: Luc Audaire, La Tronche; Gérard Merckel, Sassenage; Guy Rigaux, Grenoble, all of France

[73] Assignee: Commissariat a l'Energie Atomique, Paris, France

[21] Appl. No.: 909,985

[22] Filed: May 26, 1978

[30] Foreign Application Priority Data

May 27, 1977 [FR] France .................................. 77 16272

[51] Int. Cl.³ .................... H03K 21/34; H03K 5/14; H03H 15/02; G11C 19/28
[52] U.S. Cl. ................................ 307/221 D; 307/228; 307/350; 307/DIG. 3; 333/165; 357/24
[58] Field of Search .............. 307/221 C, 221 D, 228, 307/304, DIG. 3, 350, 352, 353, 355; 357/24; 333/165

[56] References Cited

U.S. PATENT DOCUMENTS

| | | | |
|---|---|---|---|
| 3,877,056 | 4/1975 | Bailey | 307/221 D X |
| 3,986,059 | 10/1976 | Mohsen | 307/221 D X |
| 4,005,377 | 1/1977 | Engeler | 307/221 D X |
| 4,048,519 | 9/1977 | Hoffman et al. | 307/221 D |
| 4,070,667 | 1/1978 | Eichelberger | 307/221 D X |
| 4,071,775 | 1/1978 | Hewes | 307/221 D |
| 4,075,515 | 2/1978 | Hoffman | 307/221 D X |
| 4,082,963 | 4/1978 | Hoffman | 307/221 D |
| 4,104,543 | 8/1978 | Maeding | 307/221 D |
| 4,121,117 | 10/1978 | Hoffman et al. | 307/221 D |
| 4,148,016 | 4/1979 | Alizon et al. | 307/228 X |

Primary Examiner—Larry N. Anagnos

[57] ABSTRACT

The charge-coupled device comprises at least one transfer electrode connected to a control line for transmitting a transfer signal. The circuit for measuring the charge stored in the device comprises a resistor inserted in the control line and a circuit for integrating the voltage appearing at the terminals of the resistor during application of the transfer signal.

9 Claims, 11 Drawing Figures

CIRCUIT FOR MEASURING THE CHARGE STORED IN A CHARGE-COUPLED DEVICE

This invention relates to a circuit for measuring the charge stored in a device of the charge-transfer type. A potential application of the invention is in the field of electronics in conjunction with the class of circuits designated as charge-coupled devices (abbreviated to CCD) or alternatively as bucket-brigade devices (BBD). These devices consist of semiconductor circuits in which an electric charge is introduced at one end of the circuit, then shifted at will under the action of drive signals to the other end at which the charge is collected. In some cases and especially in the application of these circuits to filtering of signals, it is necessary to perform a non-destructive test which consists in measuring the quantity of charges stored at one point of the device. The circuit in accordance with the present invention accordingly permits this possibility.

It is known that a charge-coupled device (designated hereinafter by the abbreviation CCD) is an integrated system comprising a doped (p-type or n-type) semiconductor substrate coated with a thin insulating layer having a thickness of the order of 0.1 micron and conducting electrodes disposed at uniform intervals on the insulating layer. Systems of this type therefore belong to the family of MOS circuits since they have a structure of the Metal-Oxide-Semiconductor type or in a broader sense to the family of MIS circuits (Metal-Insulator-Semiconductor circuits).

The charges which are stored and shifted in a CCD are constituted by minority carriers retained in potential wells which are created under a certain number of electrodes when these latter are brought to suitable potentials. In order to transfer these charges from one electrode to the next, the potential well is shifted from the first electrode to the second. The direction of shift is established by providing either an additional electrode or doped zones within the substrate or else fixed charges, different oxide thicknesses and so on, with the result that the potential wells have a dissymmetrical shape.

A CCD comprises three, two or even only one control line, depending on requirements and on the type of means employed to ensure unidirectional charge transfer. Solely by way of explanation, consideration will be given in the following description only to CCD's of the type comprising three control lines which are also known as the "three-phase" type if reference is made to the number of drive pulses rather than to the number of leads used for transmitting said pulses.

More details on the subject of these known devices can be obtained by referring to the article by W. S. Boyle and G. E. Smith entitled "Charge-coupled semiconductor devices" and published in The Bell System Technical Journal, April 1970, pages 587 to 593.

In regard to devices of the BBD type, relevant information can be obtained from the article by F. L. J. Sangster and K. Teer entitled "Bucket-brigade electronics—New possibilities for delay, time-axis conversion and scanning", published in "IEEE Journal of Solid-State Circuits", volume SC-4, No. 3, June 1969, Pages 131 to 136.

One application of these devices is the filtering of electrical signals. This calls for the use of a special CCD of the so-called "cut-gate" type in which a certain number of transfer electrodes are cut into two portions usually having unequal lengths. In a filter of this type, it is necessary to effect nondestructive readout of the charge stored under each cut-gate portion.

Means have already been devised for carrying out this function. A more detailed description of the design concept on which these means are based will be given hereinafter but it can already be mentioned that they make use of the signal collected in a charge-transfer control line when said control takes place and that said signal is measured either by means of charge amplifiers or by means of floating-gate circuits. However, these means do not prove satisfactory in actual practice. In fact, in the case of charge amplifiers, expected performances in regard to speed of operation cannot be achieved by means of an integrated amplifier in accordance with the technology employed for CCD's; in consequence, the measuring circuit must be fabricated on a separate support located externally with respect to the CCD chip. In the case of floating-gate circuits, it is necessary to modify the cycle of voltages applied to the CCD in order to adapt this latter to the floating-gate circuit and this adaptation results in impaired efficiency of the CCD.

The precise aim of the present invention is to provide a measuring circuit which overcomes the disadvantages outlined in the foregoing. In fact, the structure of this circuit is such as to permit fabrication strictly in accordance with CCD technology, with the result that the circuit can be included in the CCD support chip and that no modification of the CCD drive signals is required.

In precise terms, the invention relates to a circuit for measuring the charge stored in a semiconductor device of the charge-coupled type in which said device comprises at least one transfer electrode connected to a control line for transmitting a transfer signal. Said circuit essentially comprises a resistor inserted in said line and a circuit for integrating the voltage appearing at the terminals of said resistor during application of the transfer signal.

Preferably, the integrating circuit comprises a transistor of the MOS type having a source, a gate and a drain, said resistor being connected between the gate and the source whilst a capacitor is connected to the drain.

Preferably, the MOS transistor and the capacitor constitute the input element of a measuring charge-coupled device.

In the event that the CCD is of the type comprising gates cut into two portions, a measuring circuit is connected to each portion of one gate.

The distinctive features and advantages of the present invention will in any case become more readily apparent from the following description of examples of construction which are given solely by way of explanation without any limitation being implied, (especially in regard to the signals for controlling the integrating circuit), reference being made to the accompanying drawings in which.

Figure 1:
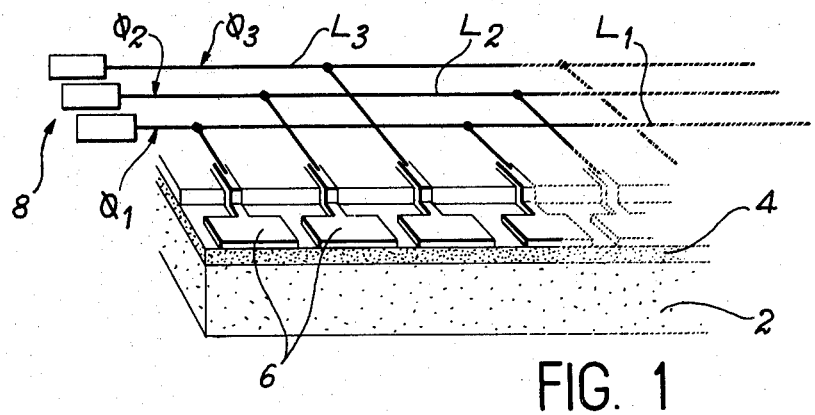
FIG. 1 is a diagrammatic view showing the known structure of a three-phase CCD.

A three-phase CCD is illustrated in FIG. 1 and comprises a semiconductor substrate 2 (of n-type doped silicon, for example) coated with an insulating thin film 4 (of silicon oxide, for example) on which are placed metallic electrodes 6. The means for bringing these electrodes to suitable potentials are constituted by a group 8 of three generators each delivering voltage pulses (or phases) $\phi_1$, $\phi_2$, $\phi_3$ carried by three control lines or leads designated respectively as $L_1$, $L_2$ and $L_3$.

Unidirectional charge transfer is obtained by making use of transfer electrode supplied by a transfer signal. In order to unify the notations, it will be assumed hereinafter that the transfer control signal is the signal $\phi_2$ carried by the line $L_2$.

In order to measure the charge stored under an electrode of a device of this type, two circuits have been proposed which utilize the signal $\phi_2$ delivered to the transfer electrode. These circuits of the prior art are shown in FIGS. 2 and 3.

Figure 2:
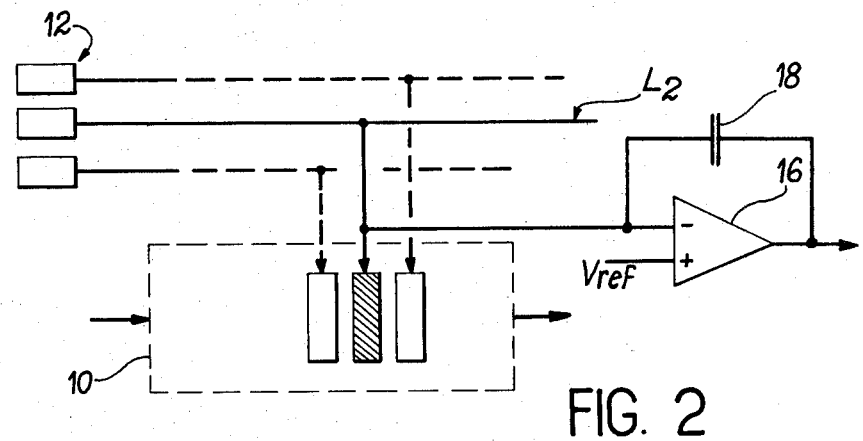
FIG. 2 shows a first circuit for measuring the charge stored in a CCD in accordance with the prior art.
Figure 3:
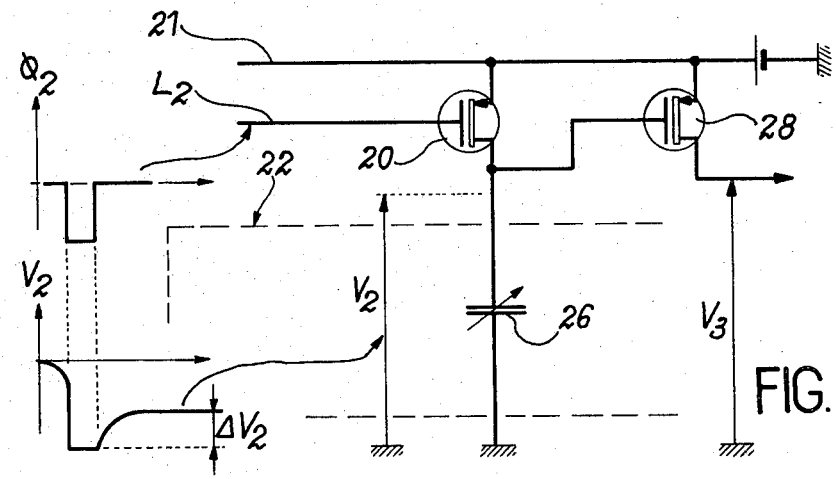
FIG. 3 shows a second circuit for measuring the charge stored in a CCD in accordance with the prior art.

In FIG. 2, a CCD 10 is controlled by a group 12 of three circuits, one of which delivers transfer signals $\phi_2$ applied to one out of three electrodes. The circuit for measuring the charge stored in the CCD comprises an amplifier 16 and a capacitor 18 mounted with negative feedback. The non-reversing input of the amplifier 16 receives a reference voltage $V_{ref}$. The reversing input is brought to the potential of the control line which is fixed in the case illustrated. Some CCD's, in fact, are so designed that a certain number of control lines have a fixed potential. This applies in particular to the CCD described in U.S. Pat. No. 4,005,377 of Jan. 25, 1977 entitled "Conductivity coupled split capacitor signal processing device and apparatus therefor". Reference can also be made to the article by K. R. Hense and T. W. Collins published in the IEEE Journal of Solid-State Circuits, vol. SC11, No. 1, February 1976, page 197, entitled "Linear charge-coupled device signal-processing techniques". It will further be observed that circuits of this type call for periodic zero-resetting of the capacitor 18, thus inevitably disturbing the operation of the CCD, one electrode of which is directly connected to said capacitor.

The amplifier 16 is a charge amplifier constituted by an operational amplifier and has the intended function of amplifying the charge delivered by the generator of phase $\phi_2$ to the transfer electrode of the CCD which is an image of the charge stored under the shaded electrode of the CCD.

In order to ensure accurate measurement by means of a circuit of this type, the rise time of the amplifier must necessarily be at least ten times shorter than that of the signal to be measured which is of the order of 100 ns. In point of fact, an amplifier having a rise time of 10 ns cannot be produced in accordance with the integrated technology which is specific to CCD's. This amplifier must therefore constitute a separate circuit located externally with respect to the integrating chip of the CCD.

The circuit of FIG. 3 which is also known is of the so-called floating-gate type. This circuit comprises a transistor 20 placed between a line 21 which is brought to a direct-current voltage and the transfer electrode of a CCD 22. The gate of said transistor is connected to the line $L_2$ which carries the signal $\phi_2$. The electrode of the CCD is represented by an equivalent electrical diagram or in other words by a capacitor 26, the value of which depends on the quantity of charges stored at the surface of the semiconductor. The circuit further comprises a transistor 28. The voltage $V_2$ appears at the terminals of the capacitor 26 and the voltage $V_3$ appears at the output. The complete assembly is integrated on the chip of the CCD to be measured.

The operation of this circuit is as follows: the transistor 20 behaves as a switch between the line 21 and the electrode. The transistor 28 reads the voltage $V_3$ between the control line and the substrate of the CCD which is usually grounded. When the transistor 20 is triggered into conduction by application of the pulse $\phi_2$, the voltage $V_2$ assumes the value of the d.c. voltage of the line 21. When the transistor is no longer in the conducting state, the voltage applied remains practically invariable but an electric charge is injected beneath the electrode of the CCD or in other words into the capacitor 26, thus shifting the value of the voltage $V_2$ which can be read at the terminals of the capacitor. This shift $\Delta V_2$ is proportional to the quantity of charge integrated in the capacitor of the CCD. The voltage $V_3$ read by the transistor 28 is the image of the voltage $V_2$ and is consequently also the image of the stored charge.

In order to ensure continuation of charge transfer within the CCD under the usual conditions, the voltage $V_2$ must be brought back to zero. The circuit therefore requires a transfer phase cycle which is specific to the CCD. As a general rule, this modification has a detrimental effect on the performances of the CCD.

The circuit in accordance with the invention overcomes the disadvantages mentioned in the foregoing. The principle of this circuit is based on the variation in apparent capacitance of the CCD from the transfer electrode when a charge is directed towards this latter or withdrawn therefrom at the time of application of the transfer control signal. Considered from the transfer electrode, the CCD in fact appears as a group of two capacitors in series. The first capacitor having a fixed value $C_{ox}$ corresponds to the oxide layer interposed between the electrode and the substrate; the second capacitor has a variable value $C_s$ and corresponds to the surface depletion zone which behaves as a reverse-biased diode whose capacitance is a function of the bias voltage. In a CCD, said bias voltage is the difference in potential which appears between the oxide-semiconductor interface and the substrate. In point of fact, said potential difference is a function of the charge stored by the CCD in said zone. This variation in capacitance produces a variation in the time constant of the charge of the electrode, said constant being defined by the product of the capacitance and the value of a resistor which is connected in series with said electrode. If the voltage appearing at the terminals of said resistor is integrated, the value obtained is dependent on said time constant and, in the final analysis, therefore represents the quantity of charge stored by the CCD.

Figure 4:
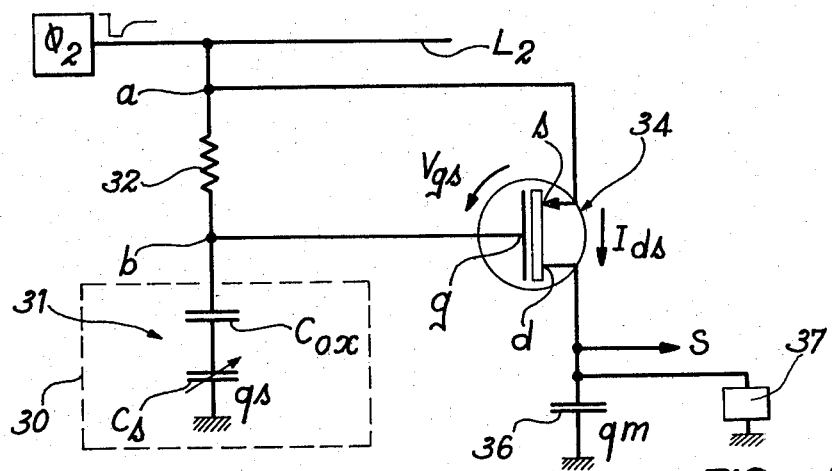
FIG. 4 is a general diagram of the circuit in accordance with the invention.

In more exact terms, the measuring circuit in accordance with the invention as shown in the diagram of FIG. 4 is associated with a CCD 30. Only one electrode of said CCD is illustrated in the form of an equivalent electrical diagram comprising two capacitors having in one case a fixed value $C_{ox}$ and in the other case a variable value $C_s$, thus forming an equivalent capacitor 31 having a capacitance $C_2$. The measuring circuit comprises a resistor 32 having a value R and connected to the control line $L_2$ which carries the transfer signal $\phi_2$, a MOS transistor 34 having a source s, a gate g and a drain d, and a capacitor 36 having a capacitance $C_m$ and associated with zero-resetting means 37. The output of the measuring circuit is delivered on the lead S. The points a and b designate the ends of the resistor 32, qs designates the charge stored in the storage capacitor $C_s$ (namely the charge to be measured), qm designates the charge of the measuring capacitor 36, $V_{gs}$ designates the voltage between the gate g and the source s of the transistor 34 and $I_{ds}$ designates the current which flows between the drain d and the source s.

The operation of this circuit is as follows: the time constant $\tau$ of the circuit formed by the resistor 32 of value R and by the equivalent capacitor 31 of value $C_2$ is equal to $RC_2$. The capacitor 31 is formed by two series-connected capacitors having the values $C_{ox}$ and $C_s$, this last value being dependent on the quantity of charge qs stored. We therefore have the relation:

$$\tau = R \frac{C_{ox} \cdot C_s}{C_{ox} + C_s}.$$

Two values $\tau'$ and $\tau''$ of the time constant $\tau$ correspond to two different values q's and q∆s of the quantity of charge stored, with $\tau'' > \tau'$, if $q_s'' > q_s'$.

Figure 5:
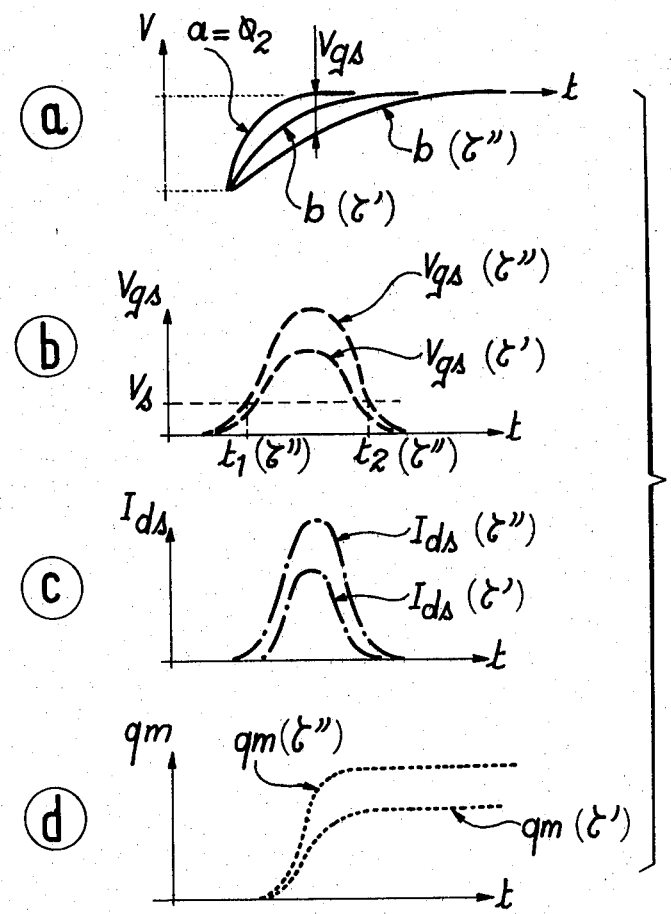
FIG. 5 shows four diagrams which serve to explain the operation of the circuit of FIG. 4.

The progressive variation of electrical values which appear in the circuit of FIG. 4 can be followed by means of the diagrams of FIG. 5.

FIG. 5a shows the progressive variation of the potentials which appear respectively at points a and b. The potential at a results from the application of the control signal $\phi_2$. It will be noted that this potential is not constant as in the prior art illustrated in FIG. 2. The progressive variation in potential at b is represented in respect of two values $\tau'$ and $\tau''$ of the time constant, where $\tau' > \tau'$.

The difference between the potentials at a and b constitutes the voltage $V_{gs}$ applied to the transistor 34. Said difference is represented in FIG. 5b in respect of the two time constants $\tau'$ and $\tau''$. The transistor is assumed to have a threshold voltage $V_s$ below which no current flows from the source to the drain. In the case of values of $V_{gs}$ higher than $V_s$, the current $I_{ds}$ varies as indicated in FIG. 5c, again in respect of the two time constants. The charge qm representing the integral of the current $I_{ds}$ within the capacitor 36 varies as shown in FIG. 5d. The final value obtained in respect of the value $\tau''$ of the time constant is higher than that which corresponds to the value $\tau'$ of said time constant. Thus, when the charge qs stored in $C_s$ increases, the charge qm stored in 36 also increases.

The variations in these different quantities can be defined quantitatively in the manner which will be explained below.

The circuit constituted by the resistor 32 of value R and by the capacitor 31 of value $C_2$ receives a voltage pulse $\phi_2$ having an exponential rise, the rise time of which is determined by the transfer control clock. If it is assumed that the rise-time constant of the transfer clock signal is equal to $RC_2$, which is the optimum case, the voltage $V_{gs}$ collected at the terminals of the resistor R is of the form:

$$V_{gs} = V_h(t/RC_2) \cdot \exp(-t/RC_2)$$

where t is the time and $V_h$ is the amplitude of the transfer pulses.

The current $I_{ds}$ resulting from the application of this voltage between the gate and the source of the MOS transistor which operates in the saturated mode is written:

$$I_{ds} = \mu C_o (Z_1/L_1)(V_{gs} - V_s)$$

where
 $Z_1$ is the width of the transistor gate,
 $L_1$ is the length of the transistor gate,
 $\mu$ is the mobility of the carriers,
 $C_o$ is the gate capacitance per unit area,
 $V_s$ is the transistor threshold voltage.

The charge stored in the capacitor having a value $C_1$ is the integral of said current between the instants in which $V_{gs}$ is higher than $V_s$. The voltage $V_1$ which appears at the terminals of the measuring capacitor 36 in respect of a given charge is inversely proportional to the area of said capacitor. If said capacitor is constituted by a plate having a length $L_2$ and a width $Z_1$ which is identical with that of the transistor gate, the result is substantially as follows:

$$V_1 = \frac{\mu}{8L_1L_2} V_s^2 RC_2 \left(\frac{1}{x_1} + \frac{1}{x_2}\right)\left(-6 + \frac{1}{x_1} + \frac{1}{x_2} + 4x_1 x_2\right)$$

with $x_1 = t_1/RC_2$
 $x_2 = t_2/RC_2$ where $t_1$ and $t_2$ the time intervals between which $V_{gs} > V_s$ (see FIG. 5b).

Finally, from a knowledge of the parameters R, $C_2$, $V_s$, $\mu$, there will be chosen in respect of the lengths $L_1$ and $L_2$ values which satisfy the relation:

$$L_1 L_2 \simeq \frac{\mu}{8V_1} V_s^2 RC_2 \left(\frac{1}{x_1} - \frac{1}{x_2}\right)\left[-6 + \frac{1}{x_1} + \frac{1}{x_2} + 4x_1 x_2\right]$$

Figure 6:
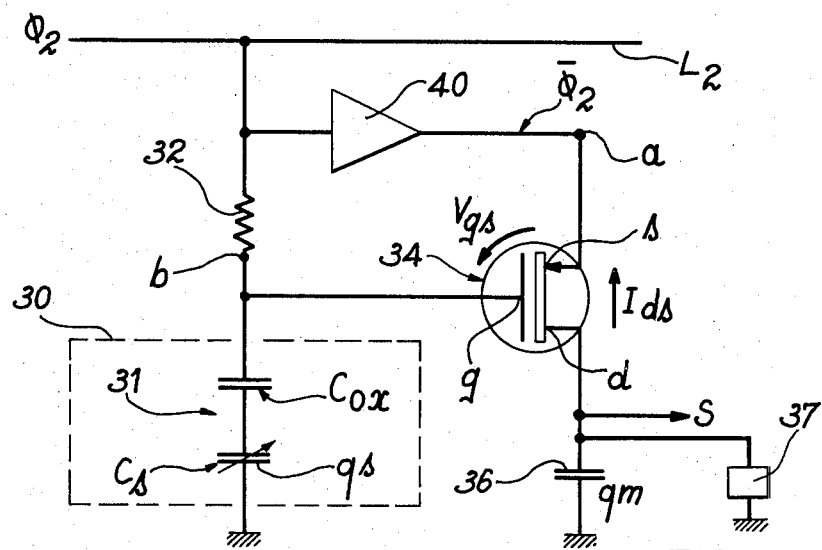
FIG. 6 shows an alternative embodiment of the circuit in accordance with the invention.

In a slightly different alternative embodiment illustrated in FIG. 6, the measuring circuit further comprises an amplifier 40 having a gain of −1 connected between the line $L_2$ and the source s of the MOS transistor. The other elements remain unchanged and are designated by the same references as in FIG. 5.

Figure 7:
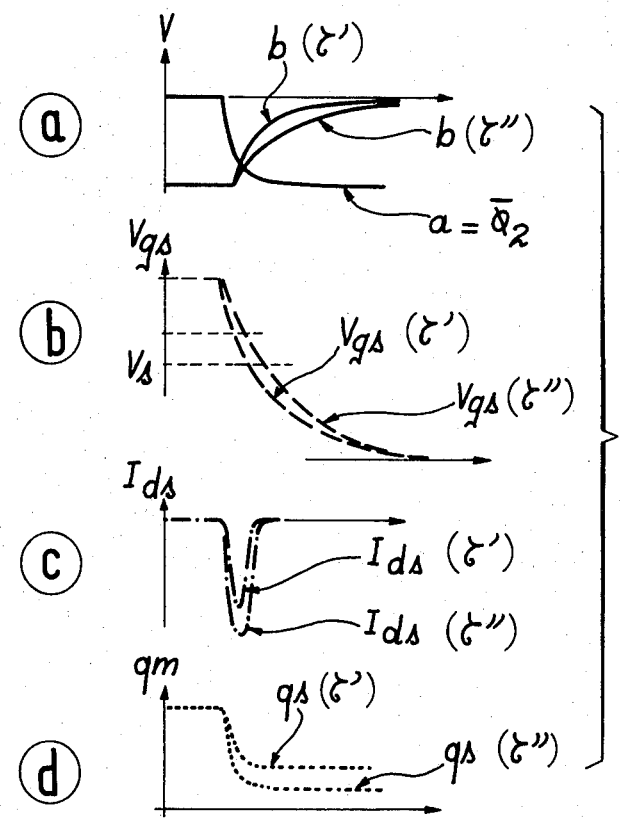
FIG. 7 shows four diagrams which serve to explain the operation of the circuit of FIG. 6.

The presence of the amplifier 40 modifies the operation of the circuit which becomes in accordance with the diagrams of FIG. 7, in which the notations and values shown are the same as in FIG. 5. The potential of the point a which is placed after the amplifier 40 varies progressively in the direction opposite to the potential of the point b (FIG. 7a). The voltage $V_{gs}$ (FIG. 7b) has a shape which is fairly different from that of FIG. 5b but the current $I_{ds}$ has a similar shape. In this alternative embodiment, it is observed that the charge qm is smaller in respect of the value $\tau''$ of the time constant than in the case of the value $\tau'$, which means that the measured charge qm varies in the direction opposite to the stored charge qs in contradistinction to the first alternative embodiment.

The original character of the essential means in accordance with the invention as described in the foregoing can once again be emphasized. When the control line is at variable potential, the current which flows through the resistor is constituted by two superposed currents: the charging current of the capacitor formed by the electrode of the CCD (it is unnecessary to measure this current) and the current associated with the transfer of charges between successive electrodes or so-called useful current, these two currents being of comparable amplitude. One of the reasons for applying the circuit of FIG. 2 only to the constant-potential control lines lies in the fact that, in this case, the first current disappears and that only the useful current is measured.

The invention consists in measuring the superposition of the two currents while noting that the first of these latter is always the same and consequently produces only a general shift of all the measuring signals.

It can be added that those versed in the art always have a tendency to seek a constant reference voltage when it proves necessary to amplify a signal (which is carried out in the circuit of FIG. 2). The invention over-rules this tendency by choosing as a reference voltage the variable voltage which is shown in FIG. 5a.

Since the means employed for the purpose of constituting the measuring circuit in accordance with the invention essentially consist of an MOS transistor and a capacitor which can be constructed in accordance with the specific CCD technology, it is an advantage to design the measuring circuit in the form of a CCD on the actual support of the CCD to be measured. As mentioned earlier, this form of construction is impossible in the case of circuits of the prior art which make use of a high-gain differential amplifier which is closed on an integrating capacitor.

Figure 8:
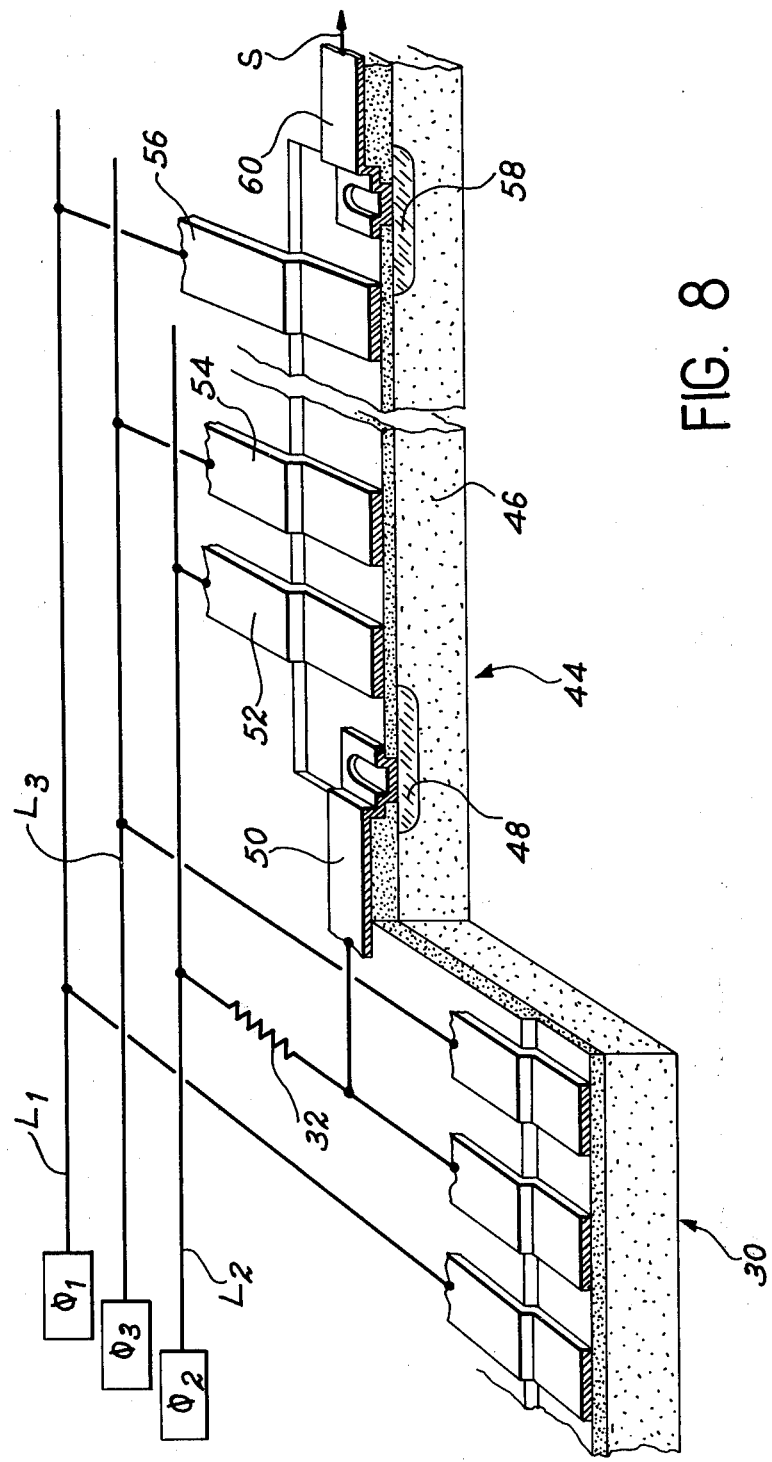
FIG. 8 shows diagrammatically one embodiment in which the measuring circuit is designed in the form of a CCD.

This embodiment in accordance with the invention is illustrated in FIG. 8.

The CCD in which the charge to be measured is stored under each of the gates connected to $P_2$ is again designated by the reference numeral 30; the measuring circuit comprises a resistor 32 inserted between the line $L_2$ and one of the transfer electrodes and a measuring CCD 44 comprising a semiconductor substrate 46 which is identical with that of the CCD to be measured, a doped region 48 (of the p-type, for example, in the event of a doped substrate of the n-type), an input electrode 50 connected to the resistor 32 and to the transfer electrode of the CCD to be measured, the assembly 48–50 being equivalent to the source of an MOS transistor; a first electrode 52 which is connected to the line $L_2$ and performs the function of a gate; an electrode 54 which performs the function of a storage capacitor; electrodes 56 forming means for transferring the charge introduced into the device; a second doped zone 58; and finally an electrode 60 in which the assembly 58–60 performs the function of a drain.

In an advantageous manner, the control phases of the reading CCD 44 can be in synchronism with the control phases of the CCD 30. To this end, it is only necessary to connect the electrodes 54 to the suitable control lines of the CCD 30. The measuring signal is then available at the output of the measuring CCD at instants which are in synchronism with the phases $\phi_1$ or $\phi_2$ or $\phi_3$ of the main CCD, depending on the number of gates of the measuring CCD 44.

It will be observed that, in this embodiment, the resetting means coincide with the shift means, which is another original feature of the circuit in accordance with the invention compared with those of the prior art as described in U.S. Pat. No. 4,005,377 and in the article by Hense and Collins cited earlier, in which provision has to be made for additional means.

Another original feature of the invention which will be noted in addition lies in the use of storage and resetting of the input stage of a CCD for the purpose of amplification. This mode of utilization is not conventional since the customary practice consists in applying a voltage which is a function of the information to be introduced during a constant sampling period during which the input voltage is practically not subject to variation. In this case, a rapidly variable voltage is applied throughout the time of variation, the sampling period (period of control of the CCD) being distinctly longer than the period of existence of the useful signal.

Figure 9:
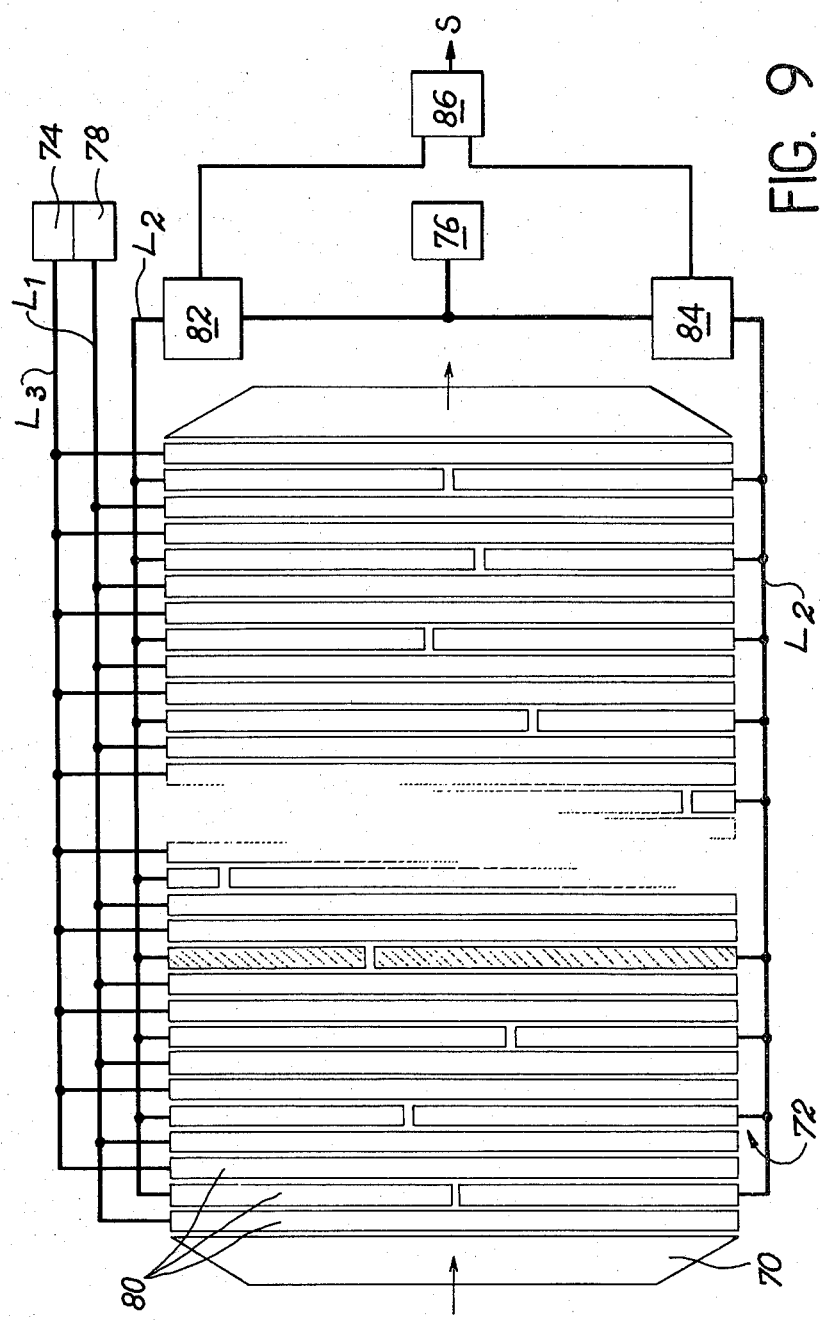
FIG. 9 shows diagrammatically a CCD transverse filter in accordance with the prior art and associated with a measuring circuit in accordance with the invention.

The circuit in accordance with the invention is advantageously employed for measuring the charge stored in a CCD of the transverse filter type having cut gates. A filter of this type is shown diagrammatically in FIG. 9 and comprises an input 70, an array of electrodes 72, clocks 74, 76, 78 connected to control lines $L_1$, $L_2$, $L_3$, each line being connected to one electrode out of three. The CCD which is illustrated is of the type comprising transfer electrodes each constituted by a gate cut into two portions of unequal width and therefore of unequal capacitance. These gates are each designated by the reference numeral 80. Each portion of gate is connected to the control line $L_2$ which is therefore constituted by two half-lines connected to the generator 76.

The theory of operation of a filter of this type does not come within the scope of the present Application. Relevent information on this subject can nevertheless be obtained from the article by D. D. Buss, D. R. Collins et Al and entitled "Transverse filtering using charge transfer devices" published in IEEE Journal of Solid-State Circuits, Vol. SC 8, No. 2, April 1973, pages 133 to 145.

In accordance with the invention, a charge-measuring circuit is placed in each of the two half-lines $L_2$ which are connected to the cut gates; the two measuring circuits are designated by the references 82 and 84. The outputs of said circuits are connected to a circuit 86 which is capable of performing an addition or subtraction function with a predetermined gain if necessary.

Figure 10:
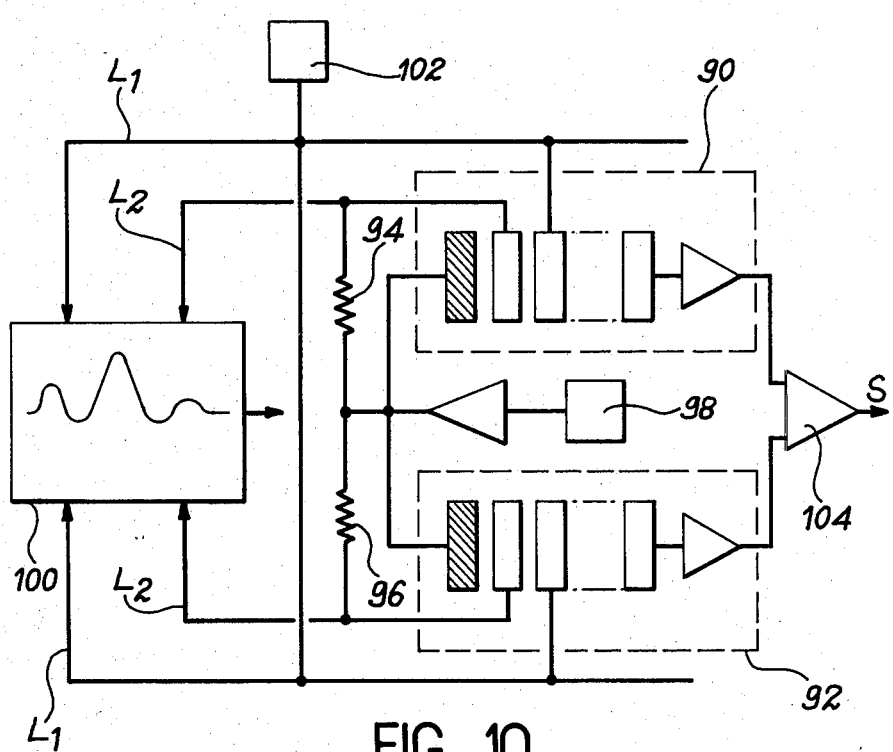
FIG. 10 illustrates one application of the circuit in accordance with the invention to a filter as shown in FIG. 9 in a first alternative embodiment.
Figure 11:
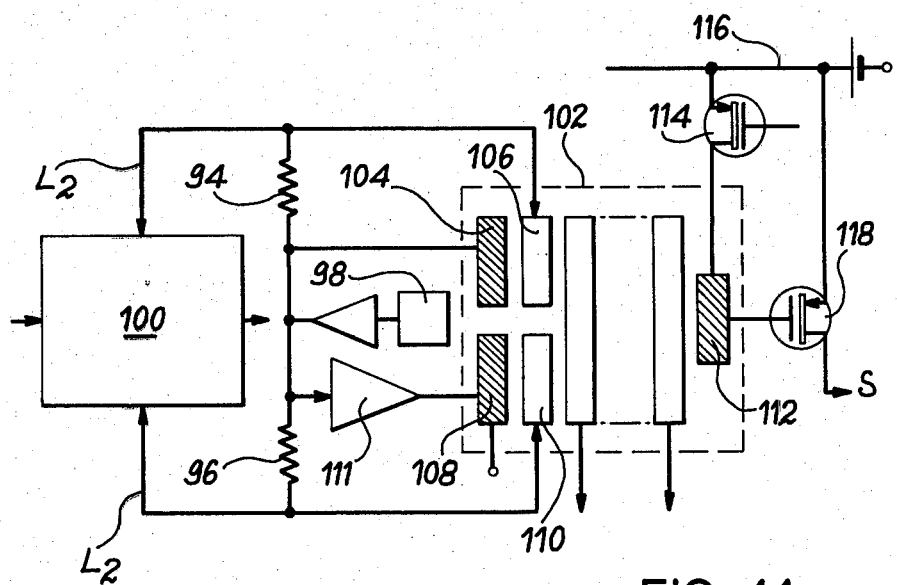
FIG. 11 illustrates one application of the circuit in accordance with the invention to the filter aforesaid but in a second alternative embodiment.

Two embodiments are illustrated in FIGS. 10 and 11 in the case described earlier in which the measuring circuit is designed in the form of a CCD.

In the first embodiment, the two measuring CCD's are identical and designated by the references 90 and 92. Said CCD's are connected to two resistors 94 and 96 inserted in the half-lines $L_2$. A generator 98 delivers a transfer control signal $\phi_2$ to the two portions of one of the transfer electrodes of the filter-CCD 100. A generator 102 which delivers a signal $\phi_1$ via a line $L_1$ serves both to control the measuring CCD's 90 and 92 and to control the filter-CCD 100. The outputs of the measuring CCD's are connected to the + and − inputs of a differential amplifier 104, the output S of which delivers a difference signal. The use of a differential amplifier of this type arises from the need to calculate, in the case of a filter-CCD, expressions which include the difference between the charges stored under two portions of any one gate.

In the second embodiment, the measuring CCD's are grouped together to form a single CCD 102 having two input elements, the first element being constituted by a doped zone 104 and a gate 106, the second element being constituted by a doped zone 108 and a gate 110. Further means are employed as in the previous embodiments, namely a control generator 98 which supplies the two half lines $L_2$ and two resistors 94 and 92. The first input element of the measuring CCD is connected to the resistor 94 and the second element is connected to the resistor 96 through an amplifier 111 having a gain of $-1$. The output takes place through a doped zone 112 which performs the function of an output diode; this diode is suitably biased by means of an MOS transistor 114 connected to a line 116 which is brought to a suitable potential. An MOS transistor 118 serves to read the output signal of the measuring CCD.

The operation of said circuit is apparent from the foregoing since the CCD 102 under consideration together with its input element 104–106 operates in the same manner as the circuit illustrated in FIG. 4 and since the same CCD under consideration together with its input element 108–110 operates in the same manner as the circuit shown in FIG. 6. Since the charge variations in these two alternative embodiments are in opposite phase, the output signal of the measuring CCD is a function of the difference between the charges measured beneath each portion of gate of the CCD 100.

The invention is particularly adapted to minimize the adverse effects of technological imperfections arising from the fabrication of filters. It is known that these imperfections are the source of errors which affect the pulsed response recorded in the filter. In order to minimize these errors, one method consists in producing a linear combination of n pulsed responses recorded in the same CCD. The outputs of the n reading CCD's must be synchronous in order that they may be combined at each instant and it is accordingly necessary to delay the outputs of the n filters with a view to ensuring that said outputs appear simultaneously. This time-delay operation can be conveniently carried out by means of the invention simply by modifying the number of gates of each reading CCD. It is worthy of note that the operational analysis which has just been made in the case of a CCD is directly applicable to a BBD in which the gate-electrode metal coatings are those of a CCD having two control lines. The diode induced by electric field in the CCD is replaced in the BBD by an anode produced during fabrication of the device.

What we claim is:

1. A charge transfer device (CTD) with a charge measuring circuit, said CTD comprising at least one transfer electrode connected to a transfer line for transmitting a transfer signal which is variable in time, wherein said charge measuring circuit comprises:
   a resistor inserted in said transfer line,
   a MOS-type transistor having a source, a gate and a drain, said resistor being connected between said gate and source,
   a capacitor connected to said drain,
   and an output connected to said drain.

2. A CTD according to claim 1, wherein an amplifier having a gain of $-1$, an input and an output, is connected between said source and said resistor, the output being connected to said source and the input to said resistor.

3. A CTD according to claim 1, wherein the capacitor is associated with resetting means.

4. A charge transfer device (CTD) with a charge measuring circuit, said CTD comprising at least one transfer electrode connected to a transfer line for transmitting a transfer signal which is variable in time, wherein said charge measuring circuit comprises:
   a resistor inserted in said transfer line,
   a measuring CTD comprising an input electrode, a transfer electrode, at least one storage electrode and an output electrode, said resistor being connected between said input electrode and said transfer electrode,
   an output connected to said output electrode.

5. A charge transfer device (CTD) of the transverse filter type with a charge measuring circuit, said CTD comprising a plurality of transfer electrodes which are cut so as to form a first portion and a second portion of electrode, said first portions of said plurality transfer electrodes being connected to a first transfer line and said second portions to a second transfer line, said first and second transfer lines transmitting a transfer signal which is variable in time, wherein said charge measuring circuit comprises:
   (A) a first measuring circuit including:
      a first resistor inserted in said first transfer line,
      a first MOS-type transistor having a source, a gate and a drain, said first resistor being connected between said gate and said source of said first transistor,
      a first capacitor connected to said drain, and
      a first output connected to said drain;
   (B) a second measuring circuit including:
      a second resistor inserted in said second transfer line,
      a second MOS-type transistor having a source, a gate and a drain, said second resistor being connected between said gate and source of said second transistor,
      a second capacitor connected to said drain, and
      a second output connected to said drain;
   (C) a differential amplifier with a first amplifier input connected to said first output, and a second amplifier input connected to said second output.

6. A charge transfer device (CTD) of the transverse filter type with a charge measuring circuit, said CTD comprising a plurality of transfer electrodes which are cut so as to form a first portion and a second portion of electrodes, said first portions of said plurality of transfer electrodes being connected to a first transfer line and said second portions to a second transfer line, said first and second transfer lines transmitting a transfer signal which is variable in time, wherein said charge measuring circuit comprises:
   (A) a first measuring circuit including:
      a first resistor inserted in said first transfer line,
      a first measuring CTD comprising a first input electrode, a first transfer electrode and at least one first storage electrode and a first output electrode, said first resistor being connected between said first input electrode and said first transfer electrode;
   (B) a second measuring circuit including:
      a second resistor inserted in said second transfer line, a second measuring CTD comprising a second input electrode, a second transfer electrode, at least one second storage electrode and a second output electrode, said second resistor being connected between said second input electrode and said second transfer electrode;

(C) a differential amplifier with a first amplifier input and a second amplifier input, said first amplifier input being connected to said first output electrode of said first measuring CTD, said second amplifier input being connected to said second output electrode of said second measuring CTD.

7. A charge transfer device (CTD) of the transverse filter type with a charge measuring circuit, said CTD comprising a plurality of transfer electrodes which are cut so as to form a first portion and a second portion, said first portions of said transfer electrodes being connected to a first transfer line and second portions to a second transfer line, said first and second transfer lines transmitting a transfer signal which is variable in time, wherein said charge measuring circuit comprises:

a first resistor inserted in said first transfer line,
a second resistor inserted in said second transfer line,
a measuring CTD comprising a first and a second input electrode in a parallel arrangement, a first and a second transfer electrode in a parallel arrangement, at least one storage electrode and an output electrode, said first resistor being connected between said first input electrode and said first transfer electrode, said second resistor being connected between said second input electrode through an amplifier having a gain of $-1$ and said second transfer electrode.

8. A CTD with a charge measuring circuit according to claim 4 or 6 or 7, wherein said CTD and said measuring CTD have control circuits which are in synchronism.

9. A charge transfer device (CTD) of the transverse filter type with a charge measuring circuit, said CTD comprising a plurality of cut transfer electrodes connected to a transfer line for transmitting a transfer signal which is variable in time, wherein said charge measuring circuit comprises a plurality of n measuring circuits, each connected to a different transfer electrode, each measuring circuit comprising:

a resistor inserted in said transfer line,
a measuring CTD comprising an input electrode, a transfer electrode, a plurality of gates and an output electrode, said resistor being connected between said input electrode and said transfer electrode, the number of gates of said measuring CTD being different from one measuring CTD to the other so as to ensure that the said plurality of output electrodes are synchronous, and comprising a combination means connected to said plurality of output electrodes.

* * * * *